United States Patent [19]

Katsura

[11] Patent Number: 5,027,325
[45] Date of Patent: Jun. 25, 1991

[54] SEMICONDUCTOR MEMORY DEVICE HAVING CIRCUIT FOR READING-OUT AND WRITING-IN OF DATA

[75] Inventor: Joji Katsura, Nishinomiya, Japan

[73] Assignee: Matsushita Electric Industrial Co., Ltd., Osaka, Japan

[21] Appl. No.: 440,480

[22] Filed: Nov. 21, 1989

Related U.S. Application Data

[63] Continuation of Ser. No. 147,346, Jan. 22, 1988, abandoned.

[30] Foreign Application Priority Data

Jan. 23, 1987 [JP] Japan ................................. 62-14534

[51] Int. Cl.$^5$ ..................... G11C 7/00; G11C 11/40; G11C 11/407
[52] U.S. Cl. .................................. 365/205; 365/207; 365/208; 365/189.01; 307/530
[58] Field of Search ........... 307/530; 365/205, 189.01, 365/149, 154, 190, 202, 206, 207, 230.06

[56] References Cited

U.S. PATENT DOCUMENTS

| | | | |
|---|---|---|---|
| 3,576,982 | 5/1971 | Duke | 371/13 |
| 4,045,779 | 8/1977 | Markle | 364/900 |
| 4,169,233 | 9/1979 | Haraszti | 365/205 X |
| 4,271,519 | 6/1981 | Hall | 371/38 |
| 4,441,171 | 4/1984 | Hoffmann | 365/205 |
| 4,451,906 | 5/1984 | Ikeda | 365/207 X |
| 4,543,500 | 9/1985 | McAlexander, III et al. | 365/205 X |
| 4,543,501 | 9/1985 | McAlexander, III et al. | 365/205 X |
| 4,553,225 | 11/1985 | Ohe | 365/201 |
| 4,555,777 | 11/1985 | Potect | 365/205 |
| 4,586,166 | 4/1986 | Shah | 365/207 X |
| 4,716,320 | 12/1987 | McAdams | 365/205 X |
| 4,730,280 | 3/1988 | Aoyama | 365/205 |
| 4,785,206 | 11/1988 | Hoshi | 365/205 X |

*Primary Examiner*—Alyssa H. Bowler
*Attorney, Agent, or Firm*—Wenderoth, Lind & Ponack

[57] ABSTRACT

Disclosed is a semiconductor memory device having a circuit integrally comprising both functions as the sense amplifier circuit for operating when reading out data from the memory cell and as the drive circuit for operating when writing data into the memory cell. By such structure, fast and stable operation of the semiconductor memory device is realized, and the area of the portions corresponding to the sense amplifier circuit and drive circuit can be reduced, so that higher density and higher degree of integration of semiconductor memory device may be realized.

6 Claims, 4 Drawing Sheets

SEMICONDUCTOR MEMORY DEVICE HAVING CIRCUIT FOR READING-OUT AND WRITING-IN OF DATA

This application is a continuation of now abandoned application, Ser. No. 07/147,346 filed on Jan. 22, 1988.

BACKGROUND OF THE INVENTION

This invention relates to a semiconductor memory device, and more particularly to a semiconductor memory device having a circuit which functions as a sense amplifier for reading-out of data and also functions as a drive circuit for writing-in of data.

A semiconductor memory device, generally, comprises memory cells in which data are stored, switching transistors coupled to the memory cells, sense amplifiers for reading data out of the memory cells, pairs of bit lines through which data are transferred, word lines through which address signals are applied to the switching transistors, drive circuits for writing data in the memory cells, pairs of data lines through which data are transferred from outside, and so on.

In the case where data are read out of the memory cells in the above-stated semiconductor memory device, an address signal is first applied through a word line to a switching transistor so that a selected memory cell is electrically coupled to a bit line, and data stored in the memory cell appears between a pair of bit lines as a difference of electric potential. Such a minute amplitude of the electric potential due to the read-out data is then amplified by a sense amplifier. After such amplification is carried out sufficiently, the amplified electric potential is readout through a data line to an input/output circuit.

On the other hand, in the case where data is written in a memory cell, data to be written is applied to a drive circuit and a pair of data lines are driven by the drive circuit so that the data to be written is transferred to a memory cell, and stored in the memory cell.

Upon the data writing-in operation, sense amplifiers are in an OFF state, while upon the data reading-out operation, drive circuits are in an OFF state. In other words, when a drive circuit is operating, sense amplifiers are not operated and when a sense amplifier is operating, drive circuits are not operated.

As explained above, a conventional semiconductor memory device has sense amplifiers and drive circuits separately.

SUMMARY OF THE INVENTION

The present invention, therefore, has as its principal object the provision of an improved semiconductor memory device which has circuits, each functioning as a sense amplifier upon data reading-out and as a drive circuit upon data writing-in.

This and other objects are accomplished according to the present invention, by a semiconductor memory device which comprises a memory cell for storing information data therein, a pair of signal lines through which said data is transferred, a first switching circuit through which one of said signal lines is coupled to a first data line, a second switching circuit through which the other signal line is coupled to a second data line, a first inverter circuit whose input is coupled to said first data line and whose output is coupled to said second data line, and a second inverter circuit whose input is coupled to said second data line and whose output is coupled to said first data line, said first and second inverter circuits being coupled through said switching circuit to one of ground and power supply voltage.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
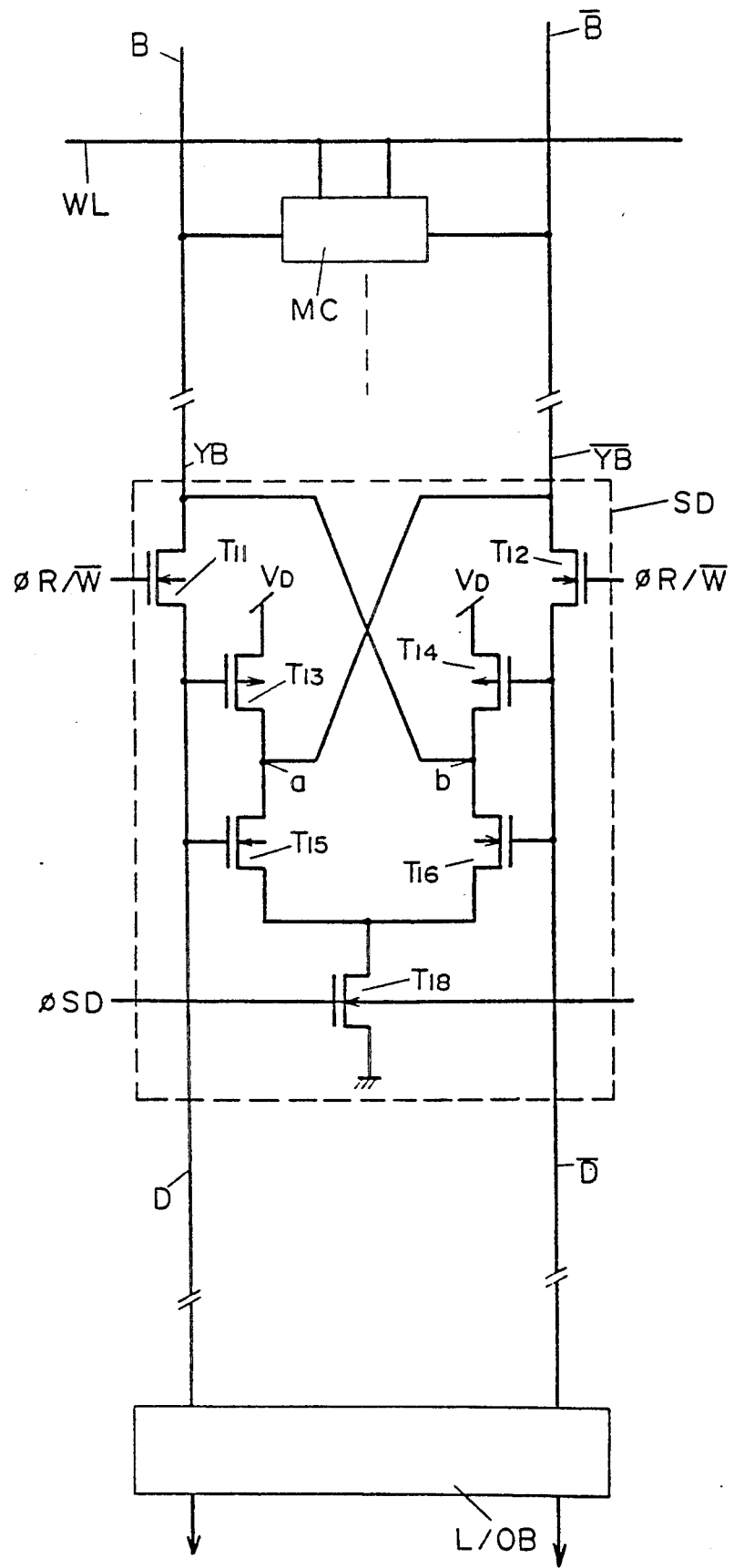
FIG. 1 is a circuit diagram of a first embodiment according to the invention.

FIG. 1 shows a part of a semiconductor memory device as a first embodiment of the invention. Generally, a plurality of FIG. 1 structures are gathered to thereby form a semiconductor memory device. A pair of bit lines B, $\overline{B}$ are coupled to a sense amplifier/drive circuit SD. A plurality of memory cells MC are coupled to said bit lines B, $\overline{B}$. A memory cell comprises a switching transistor and a memory cell capacitor. A memory cell capacitor is coupled to the bit line through a switching transistor. Each switching transistor is controlled by each word line WL through which an address signal is transferred. When an address signal is applied, a switching transistor is rendered conductive so that a memory cell capacitor is electrically connected to a bit line.

The circuit SD is externally coupled through a pair of data lines D, $\overline{D}$ and latch/output buffer circuit L/OB. YB, $\overline{YB}$ indicate a pair of signal lines. YB, $\overline{YB}$ may be another pair of bit lines B, $\overline{B}$ or may be a pair of data lines D, $\overline{D}$. $\phi R/\overline{W}$ is a functional control signal in the sense amplifier/drive circuit SD, and when $\phi R/\overline{W}$ is H (high), the circuit SD functions as the sense amplifier for reading out, and when it is L (low), the circuit SD functions as the drive circuit for writing in. $\phi_{SD}$ is an operational control signal of the sense amplifier/ drive circuit SD. $T_{11}$ that $T_{18}$ are transistors to make up the circuit SD, and in this embodiment transistors $T_{11}$, $T_{12}$, $T_{13}$, $T_{14}$, $T_{15}$, $T_{16}$, $T_{18}$ are MOS transistor $T_{13}$ and $T_{14}$ being p-channel MOS transistors and the others being n-channel MOS transistors. Transistor $T_{18}$ is grounded, and a supply voltage $V_D$ is applied to transistors $T_{13}$, $T_{14}$.

The relation of connection of these transistors is as follows. First, transistors $T_{11}$, $T_{12}$ are directly inserted into signal lines YB, $\overline{YB}$, respectively, and a functional control signal $\phi R/\overline{W}$ is applied to their gates. Transistors $T_{13}$, $T_{15}$ are serially connected, and the gate of each transistor is connected to the signal line YB. Transistors $T_{14}$, $T_{16}$ are also connected serially, and the gate of each transistor is connected to the signal line $\overline{YB}$. Connecting points a, b of these transistors are respectively connected to the signal lines $\overline{YB}$, YB. Transistors $T_{15}$, $T_{16}$ are commonly connected and are grounded through transistor $T_{18}$. An operational control signal $\phi_{SD}$ is applied to the gate of this transistor $T_{18}$.

In data reading-out operation from the memory cell MC, the information of the data being read out as the potential difference between a pair of bit lines B, $\overline{B}$ from the memory cell capacitor appears, and it is propagated and appears as the potential difference between a pair of signal lines YB, $\overline{YB}$. At this time, the control signal $\phi R/\overline{W}$ of the sense amplifier/drive circuit SD is H when reading out and $T_{11}$, $T_{12}$ are in ON state, and the data being read out of the memory cell MC becomes the potential difference between a pair of signal lines YB, $\overline{YB}$, and at the timing when the value becomes sufficient so that the sense amplifier/drive circuit SD functions correctly as the sense amplifier, the control signal $\phi_{SD}$ becomes H and transistor $T_{18}$ is set in ON state, thereby starting operation as sense amplifier. This operation functions same as the sense amplifier operation of latch type, and it is possible to quickly amplify the potential difference appearing between the pair of signal lines YB, $\overline{YB}$, and data lines D, $\overline{D}$.

The data sufficiently amplified by the sense amplifier operation is propagated to, for example, a latch/output buffer L/OB, and is read out to outside.

On the other hand, when writing data in the memory cell MC, when the control signal $\phi R/\overline{W}$ becomes L, the transistors $T_{11}$, $T_{12}$ which make up the switching circuit become OFF state, and the gates of the transistors $T_{13}$, $T_{15}$, and $T_{14}$, $T_{16}$ are electrically cut off from the pair of signal lines YB, $\overline{YB}$, respectively, whereas the transistor $T_{18}$ is in ON state by the control signal $\phi_{SD}$, thereby composing inverter circuits whose outputs are $\overline{YB}$, YB as seen from the side of data lines D, $\overline{D}$ by means of $T_{13}$, $T_{15}$ and $T_{14}$, $T_{16}$. THerefore, the writein data entered in the data lines D, $\overline{D}$ are fed into said inverter circuits, which function as drive circuits for writing in, and drive outputs are obtained as the data to the pair of signal lines YB, $\overline{YB}$, so that the data are written into the memory cell MC selected by the address signal through bit lines B, $\overline{B}$.

Thus it is known that the different functions of drive operation when writing in data and amplification of data when reading out can be realized by a single circuit of sense amplifier/drive circuit SD.

By using thus composed circuit, when writing in right after reading out the data of the memory cell, it is possible to operate as drive circuit for the input data instantly from the previous operation as sense amplifier by means of $\phi R/\overline{W}$ signal. Such series of reading-out and writing-in operations is difficult in the circuit composition of a general memory circuit, and by employing the circuit of this invention, high speed operation and easy timing control are realized at the same time.

Figure 2:
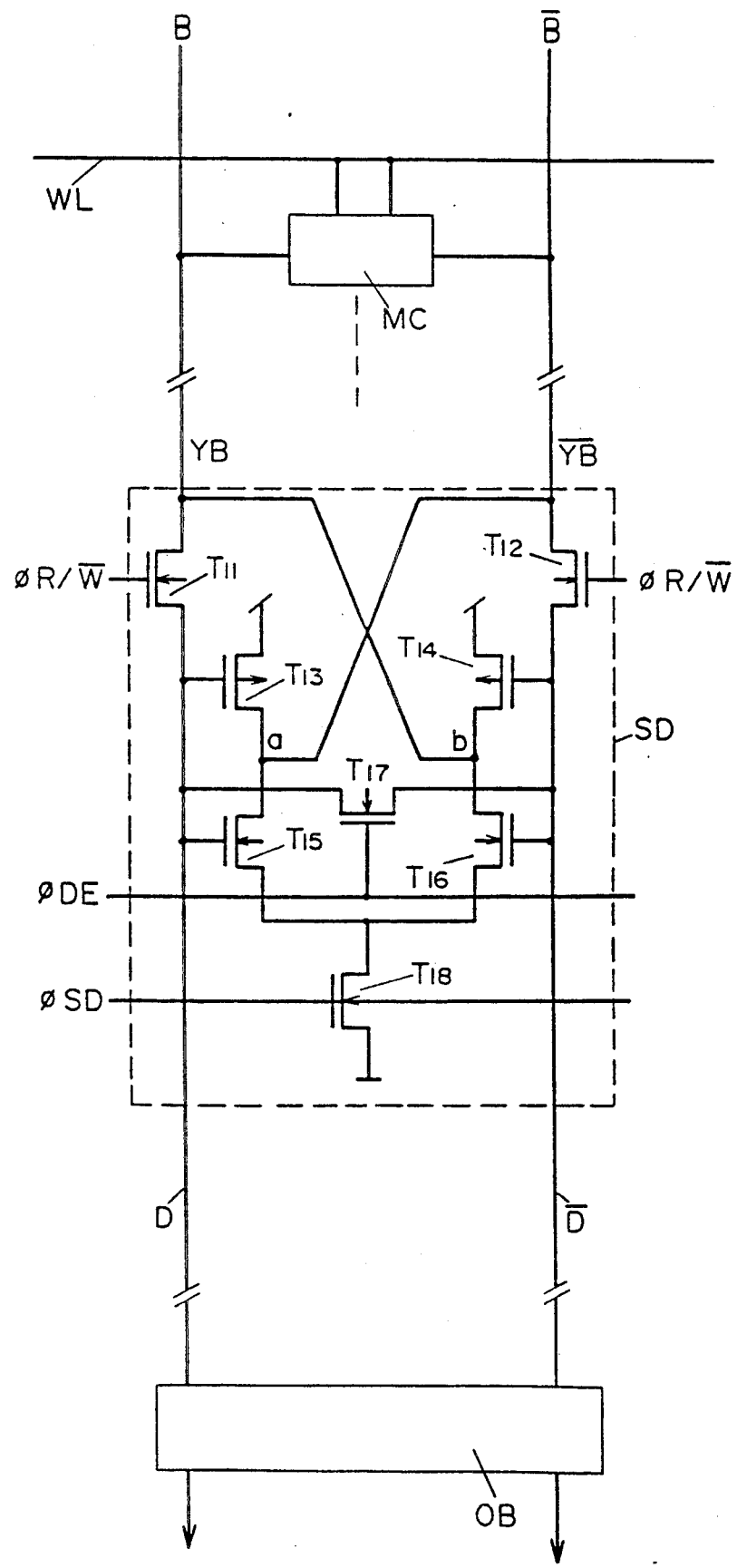
FIG. 2 is a circuit diagram of a second embodiment according to the invention.

FIG. 2 is an equivalent circuit showing a second embodiment of this invention, in which same constituent parts as in FIG. 1 are identified with same part numbers and are not specifically described herein.

The structure of the second embodiment is similar to that of the first embodiment except that a transistor $T_{17}$ is connected between the pair of signal lines YB, $\overline{YB}$ in order to short-circuit them, and that control signal $\phi_{DE}$ is applied to the gate of this transistor $T_{17}$. Meanwhile, $T_{11}$, $T_{12}$, $T_{13}$, $T_{14}$, $T_{15}$, $T_{16}$, $T_{17}$, $T_{18}$ are MOS transistors, $T_{13}$, $T_{14}$ being p-channel MOS transistors and the others n-channel MOS transistors.

In the data reading-out operation from the memory cell MC, the information of the data being read out as the potential difference between a pair of bit lines B, $\overline{B}$ appears, and it is propagated and appears as the potential difference between a pair of signal lines YB, $\overline{YB}$. At this time, the control signal $\phi R/\overline{W}$ of the sense amplifier/drive circuit SD is H when reading out, and the transistors $T_{11}$, $T_{12}$ are in ON state, and the data being read out of the memory cell MC becomes the potential difference between the pair of signal lines YB, $\overline{YB}$, and at the timing when the value becomes sufficient so that the sense amplifier/drive circuit SD correctly functions as the sense amplifier, the control signal $\phi_{SD}$ becomes H, and $T_{18}$ is set in ON state, so that the operation as sense amplifier is started. This operation functions same as the sense amplifier operation of latch type, and it is possible to quickly amplify the potential difference appearing between the pair of signal lines YB, $\overline{YB}$ and data lines D, $\overline{D}$. Prior to this operation, when the sense amplifier/drive circuit SD is in OFF state by the control signal $\phi_{DE}$, the transistor $T_{17}$ is set in ON state to equalize the potential difference of data lines D, $\overline{D}$, which makes it possible to reset the potential difference of the data appearing on the data lines D, $\overline{D}$ when reading out or writing in the preceding cycle. As a result, data can be written in and read out at high speed, and the sense amplifier/ drive circuit can operate stably without being affected by the state of the preceding data. The data sufficiently amplified by the sense amplifier operation is propagated, for example, to the output buffer, and read out.

On the other hand, when writing data into the memory cell MC, as the control signal $\phi R/\overline{W}$ becomes L, the transistors $T_{11}$, $T_{12}$ to compose first and second switching circuits become OFF state, and the gates of transistors $T_{13}$, $T_{15}$ and $T_{14}$, $T_{16}$ are electrically cut off from the pair of signal lines YB, $\overline{YB}$ respectively, while the transistor $T_{18}$ is in ON state by the control signal $\phi_{SD}$, thereby composing first and second inverter circuits of which outputs are $\overline{YB}$, YB as seen from the side of data lines D, $\overline{D}$ by means of transistors $T_{13}$, $T_{15}$ and $T_{14}$, $T_{16}$, respectively. Therefore, the write-in data entered in the data lines D, $\overline{D}$ are fed into said inverter circuits, and these inverter circuits operate as drive circuits when writing in, and drive outputs are obtained as the data to the pair of signal lines YB, $\overline{YB}$, so that the data is written into the selected memory cell through the bit line.

In the first and second embodiments, meanwhile, $T_{11}$, $T_{12}$, $T_{15}$, $T_{16}$, $T_{17}$, $T_{18}$ are n-channel MOS FETs and $T_{13}$, $T_{14}$ are p-channel MOS FETs, which are combined to make up the sense amplifier/drive circuit, but in this invention it is evident that the same effects can be obtained by the composition of other transistors having similar functions, and the n-channel and p-channel transistors are not intended to limit this invention. As for the control signal, too, if a similar operation is possible with respect to the operation control, it may be also used in the ON operation control of the circuit composed of transistors of which signal potential is either H (high) or L (low).

Figure 3:
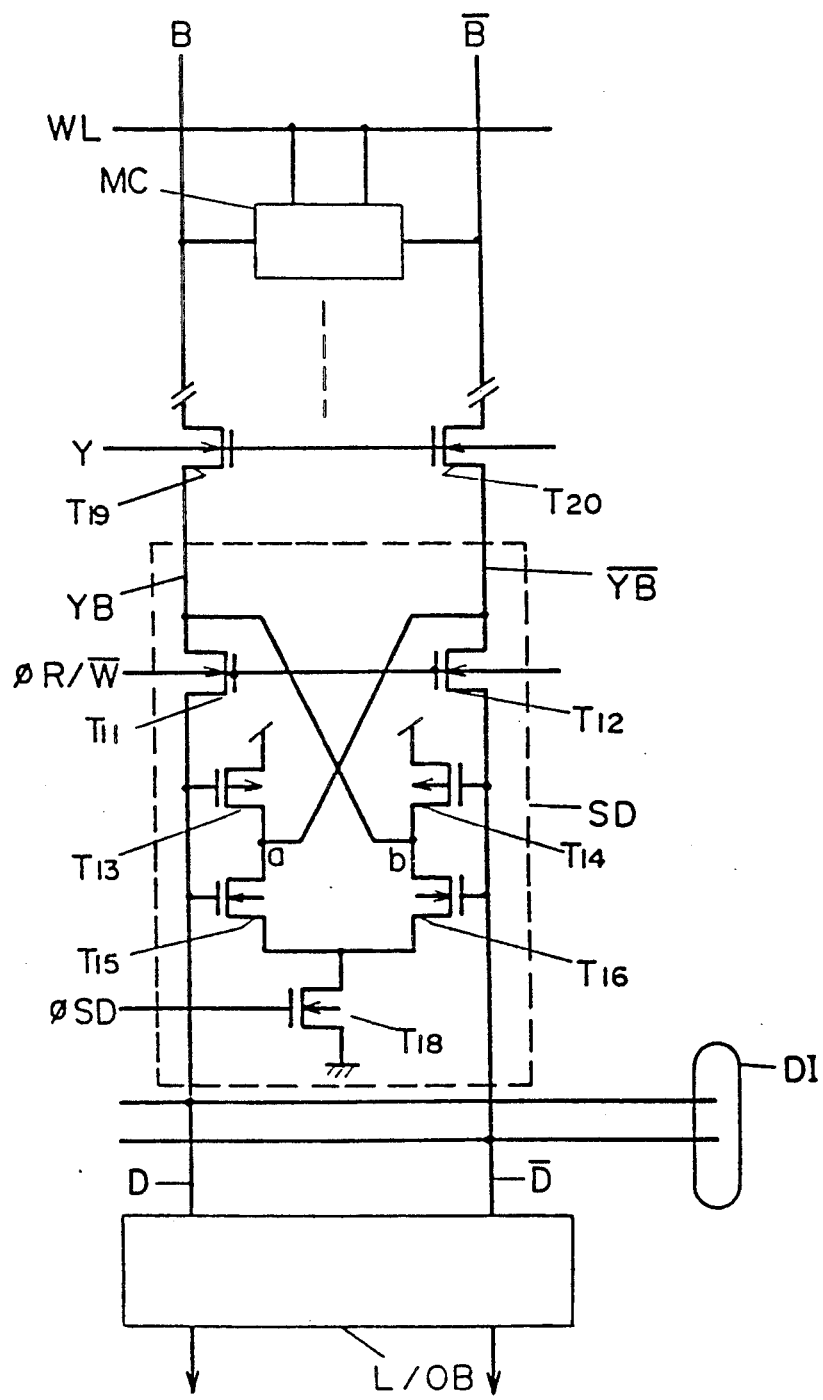
FIG. 3 is a circuit diagram of a third embodiment according to the invention.

FIG. 3 is an equivalent circuit of essential parts of the equipment of a third embodiment of this invention, in which, same as in FIG. 1 and FIG. 2, MC denotes a memory cell, L/OB is a latch/output buffer circuit, WL is a word line, B, $\overline{B}$ are a pair of bit lines, VB, $\overline{VB}$ are a pair of signal lines, Y is a column address, SD is a sense amplifier/drive circuit, $\phi R/W$ is a control signal of the sense amplifier/drive circuit, $\phi_{SD}$ is a control signal for sense amplifier operation and drive operation, DI is an input data signal, and D, $\overline{D}$ are a pair of data signal lines.

The third embodiment is similar to the first embodiment, except that transistors $T_{19}$, $T_{20}$ are serially inserted into the pair of signal lines YB, $\overline{YB}$ connected to the circuit SD, respectively, and that these transistors are controlled by the column address Y.

In the data reading-out operation from the memory cell MC, by starting-up of the word line WL, the switching transistor connected between the memory cell and the pair of bit lines B, $\overline{B}$ is rendered to be conductive, and the data held in the memory cell appears as the potential difference, together with the time, between the pair of bit lines B, $\overline{B}$. At this time, the control signal $\phi R/\overline{W}$ of the sense amplifier/drive circuit becomes H when reading out, and the address is selected by the column address Y from the column address recorder, so that the transistors, $T_{19}$, $T_{20}$ become ON, thereby propagating the potential difference appearing on the bit lines to the signal lines VB, $\overline{VB}$. By the above-mentioned signal $\phi R/\overline{W}$, the transistors $T_{11}$, $T_{12}$ are in ON state, and the data being read out on the bit lines is propagated through this switching circuit, and appears as the signal potential difference at the input gates $T_{13}$, $T_{14}$, $T_{15}$, $T_{16}$ of the circuit functioning as the sense amplifier circuit, and at the timing when the value becomes sufficient for correct operation of the circuit SD, the transistor $T_{18}$ is turned on by the control signal $\phi_{SD}$, thereby starting the sense amplifier operation. This operation is same as the operational function of the sense amplifier of latch type, and it is possible to quickly amplify the potential difference appearing at the signal lines VB, $\overline{VB}$. The sufficiently amplified data is propagated to the latch/output buffer circuit L/OB through the data lines D, $\overline{D}$, and is delivered to outside.

On the other hand, when writing data in the memory cell MC, as the control signal $\phi R/\overline{W}$ becomes L, the transistors $T_{11}$, $T_{12}$ to make up the switching circuit are turned off, and the gates of $T_{13}$, $T_{15}$, $T_{14}$, $T_{16}$ and the signal lines VB, $\overline{VB}$ are non-conductive, and since the transistor $T_{18}$ is set to operate to write in the ON state by the control signal $\phi_{SD}$, it is known that the transistors $T_{13}$ and $T_{15}$, and $T_{14}$ and $T_{16}$ compose the input gates of inverter circuits as seen from the side of data input signal DI. Therefore, the write-in data transmitted from the data input signal DI is entered respectively as data D and $\overline{D}$ into the inverter circuits through data lines D, $\overline{D}$. The inverter circuits function as the drive circuits for writing in, and the data are transmitted to the bit lines B, $\overline{B}$ by the selected column address Y after being propagated to the signal lines VB, $\overline{VB}$, and written into memory cell of the selected word line WL.

Figure 4:
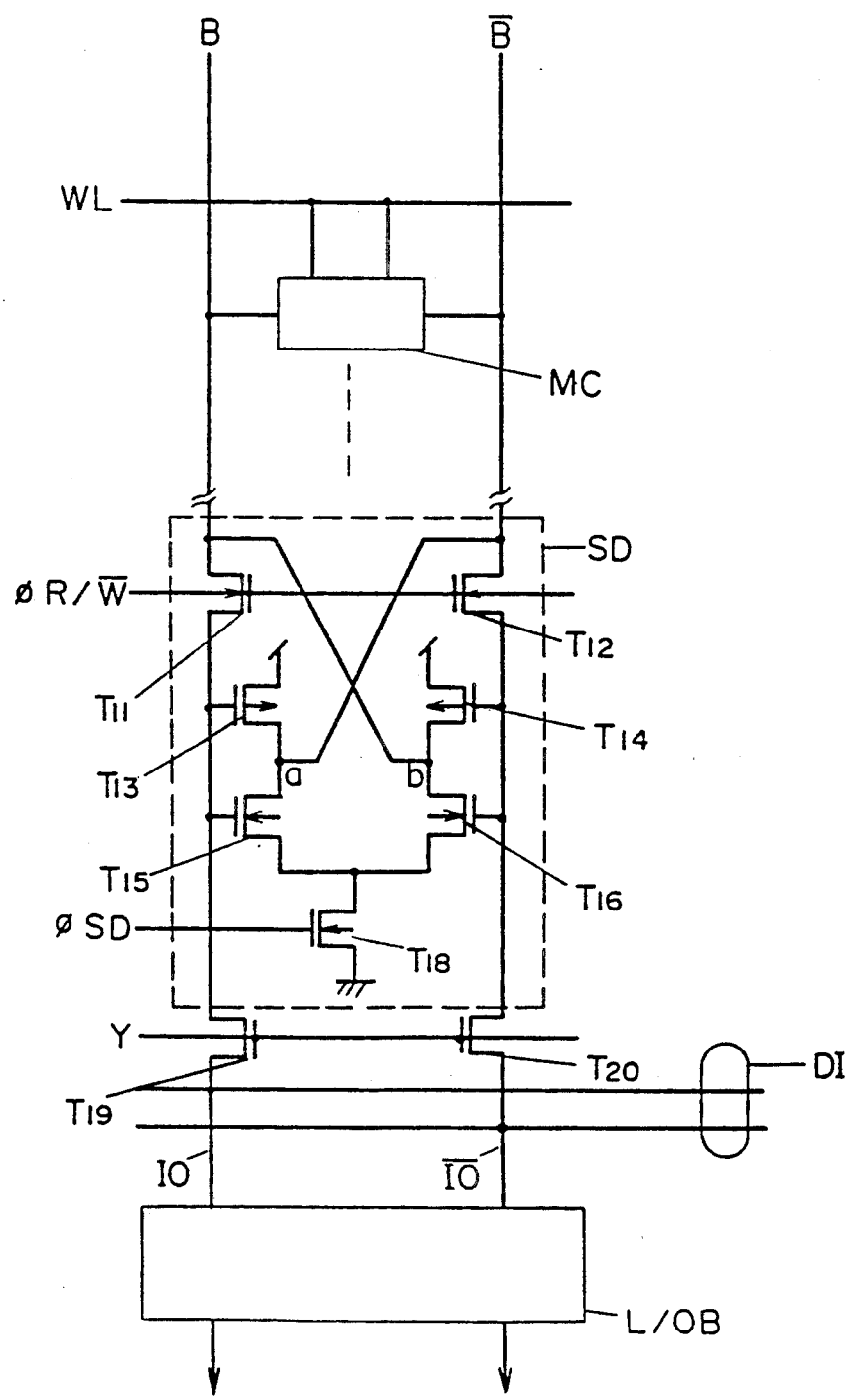
FIG. 4 is a circuit diagram of a fourth embodiment according to the invention.

FIG. 4 is an equivalent circuit diagram showing a fourth embodiment of this invention, in which, same as in FIG. 3, MC denotes a memory cell, L/OB is a latch/output buffer circuit, WL is a word line, B, $\overline{B}$ are a pair of bit lines, D, $\overline{D}$ are a pair of data lines, Y is a column address, SD is a sense amplifier/drive circuit, $\phi R/\overline{W}$ is a control signal of sense amplifier/ drive circuit $\phi_{SD}$ is a control signal of sense amplifier operation and drive operation, and DI is an input data signal. The structure of FIG. 4 is similar to that of FIG. 3, except that the configuration of transistors $T_{19}$, $T_{20}$ is different. That is, the transistors $T_{19}$, $T_{20}$ are connected to data lines D, $\overline{D}$.

In the data reading-out operation from the memory cell MC, the data held in the memory cell appears, as the word line WL is stated up, as the potential difference together with the time between the pair of bit lines B, $\overline{B}$. At this time, the control signal $\phi R/\overline{W}$ of the sense amplifier/drive circuit SD is H when reading out, and the transistors $T_{11}$, $T_{12}$ to make up the switching circuit of bit line is in ON state and is conductive. The data being read out of the memory cell becomes the potential difference of the bit lines B, $\overline{B}$, and at the timing when the value becomes sufficient for correct operation of the sense amplifier, the $T_{18}$ is turned on by the control signal $\phi_{SD}$, thereby starting up the sense amplifier operation. This operation is the same function as the sense amplifier operation of latch type, and it is possible to quickly amplify the potential difference appearing on the bit lines. The sufficiently amplified data is read out into the data lines by the selected column address Y, and is transmitted to the latch/output buffer circuit.

On the other hand, in the data writing-in operation into the memory cell MC, as the control signal $\phi R/\overline{W}$ becomes L, the transistors $T_{11}$, $T_{12}$ to make up the switching circuit are turned off, and the gates of $T_{13}$, $T_{15}$ and $T_{14}$, $T_{16}$ become non-conductive to the bit lines B, $\overline{B}$, while the transistor $T_{18}$ is turned on by the control signal $\phi_{SD}$, thereby making up inverter circuits, as seen from the side of the data lines D, $\overline{D}$, by means of $T_{13}$, $T_{15}$ and $T_{14}$, $T_{16}$. Therefore, the write-in data being sent in from the data input signal DI is fed into the inverter circuit through the selected column address Y. This inverter circuit functions as the drive circuit for writing in, and the data is written into the pair of bit lines B, $\overline{B}$, and is finally written into the memory cell of the selected word line WL.

In the embodiments shown in FIG. 3 and FIG. 4, $T_{11}$, $T_{12}$, $T_{15}$, $T_{16}$, $T_{18}$ are n-channel MOS FETs, and $T_{13}$, $T_{14}$ are p-cgannel MOS FETs to compose the sense amplifier/drive circuit, but it is evident in this invention that the same effects can be obtained by the composition of other transistors having similar functions. Besides, as for the operation control of control signal, if a similar operation is possible, the wiring area of the data line connected to the value of either H (high) or L (low) may be omitted, and the area can be reduced. Furthermore, the data input, output circuits of the semiconductor memory can be further simplified by the one-body assembled circuit of this invention, which is very effective for reducing the area of the semiconductor memory having multiple bit inputs and outputs, and for raising the density and enhancing the degree of integration of semiconductor memory.

Incidentally, although FIGS. 1 (FIGS. 2-4) shows simply one unit in a semiconductor memory device such as a static random access memory, an actual memory includes, of course, a plurality of units therein, i.e., a plurality of memory cells, a plurality of circuits SD etc.

Thus, according to this invention, firstly, by realizing the sense amplifier circuit and drive circuit by a single circuit, the area occupied conventionally by these two circuits in the chip of semiconductor memory can be significantly reduced. Secondly, since the wiring region for the data lines for mutually connecting the sense amplifier circuit and drive circuit can be omitted, this area can be reduced. Thirdly, having an equalizer switching circuit placed between input and output lines, the data writing-in and reading-out operation can be done at high speed and the sense amplifier/drive circuit can be operated stably without being affected by the previous data. Fourthly, by the one-body assembled circuit of this invention, the input, output circuits of the data of semiconductor memory can be further simplified, which is very effective for reduction of the area of semiconductor memory having multiple bit inputs and outputs, and also for raising the density and enhancing the degree of integration of general semiconductor memories.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A static RAM device comprising:
   a memory cell for storing information data therein;
   first and second signal lines through which said information data is transferred from said memory cell;
   a first MOS transistor through which said first signal line is coupled to a first data line;
   a second MOS transistor through which said second signal line is coupled to a second data line;
   a first inverter circuit, including third and fourth MOS transistors, whose input is coupled to said first data line and whose output is coupled to said second signal line; and
   a second inverter circuit, including fifth and sixth MOS transistors, whose input is coupled to said second data line and whose output is coupled to said first signal line,
   said first and second inverter circuits being coupled through a seventh MOS transistor to one of a ground and a power supply voltage;
   wherein, when said first and second MOS transistors are in an ON state, said first and second inverter circuits and said first and second MOS transistors operate as a sense amplifier for reading information data; and
   wherein, when said first and second MOS transistors are in an OFF state, said first and second inverter circuits operate as drive circuits for writing information data.

2. A semiconductor memory device of claim 1, further comprising an eighth MOS transistor for coupling said first and second data lines to thereby equalize an electric potential on said first and second data lines.

3. A semiconductor memory device of claim 1, wherein said signal lines are data lines.

4. A semiconductor memory device of claim 1, wherein said signal lines are bit lines.

5. A static RAM device comprising:
   a memory cell for storing information data therein;
   first and second signal lines through which said information data is transferred from said memory cell;
   a first MOS transistor through which said first signal line is coupled to a first data line;
   a second MOS transistor through which said second signal line is coupled to a second data line;
   a first inverter circuit, including third and fourth MOS transistors, whose input is coupled to said first data line and whose output is coupled to said second signal line;
   a second inverter circuit, including fifth and sixth MOS transistors, whose input is coupled to said second data line and whose output is coupled to said first signal line;
   a seventh MOS transistor for coupling said first and second data lines to thereby equalize an electric potential on said first and second data lines;
   wherein, when said first and second MOS transistors are in an ON state, said first and second inverter circuits and said first, second and seventh MOS transistors operate as a sense amplifier for reading information data; and
   wherein, when said first and second MOS transistors are in an OFF state, said first and second inverter circuits operate as drive circuits for writing information data.

6. A static RAM device comprising:
   a memory cell for storing information data therein;
   first and second signal lines through which said information data is transferred from said memory cell;
   a first MOS transistor disposed in said first signal line;
   a second MOS transistor disposed in said second signal line;
   a first inverter circuit disposed between a power supply terminal and ground including third and fourth MOS transistors connected to each other whose gates are connected to a first data line; and
   a second inverter circuit disposed between said power supply terminal and ground including fifth and sixth MOS transistors connected to each other whose gates are connected to a second data line,
   said first and second inverter circuits including a common seventh MOS transistor as a common control transistor for controlling the operation of said first and second inverter circuits;
   wherein, when said first and second MOS transistors are in an ON state, said first and second inverter circuits and said first and second MOS transistors operate as a sense amplifier for reading information data; and
   wherein, when said first and second MOS transistors are in an OFF state, said first and second inverter circuits operate as drive circuits for writing information data.

* * * * *